(12) United States Patent
Hino et al.

(10) Patent No.: US 7,994,503 B2
(45) Date of Patent: Aug. 9, 2011

(54) CU ALLOY WIRING FILM, TFT ELEMENT FOR FLAT-PANEL DISPLAY USING THE CU ALLOY WIRING FILM, AND CU ALLOY SPUTTERING TARGET FOR DEPOSITING THE CU ALLOY WIRING FILM

(75) Inventors: Aya Hino, Kobe (JP); Katsufumi Tomihisa, Kobe (JP); Hiroshi Gotou, Kobe (JP); Takashi Onishi, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 209 days.

(21) Appl. No.: 12/517,362

(22) PCT Filed: Dec. 4, 2007

(86) PCT No.: PCT/JP2007/073419
§ 371 (c)(1),
(2), (4) Date: Jun. 3, 2009

(87) PCT Pub. No.: WO2008/069214
PCT Pub. Date: Jun. 12, 2008

(65) Prior Publication Data
US 2010/0012935 A1  Jan. 21, 2010

(30) Foreign Application Priority Data
Dec. 4, 2006 (JP) ................. 2006-327451

(51) Int. Cl.
*H01L 29/04* (2006.01)
(52) U.S. Cl. .............. 257/57; 257/E29.151; 438/149
(58) Field of Classification Search .......... 257/57, 257/E29.151; 438/149
See application file for complete search history.

(56) References Cited

U.S. PATENT DOCUMENTS
5,514,909 A   5/1996  Yamamoto et al.
(Continued)

FOREIGN PATENT DOCUMENTS
JP         7 66423         3/1995
(Continued)

OTHER PUBLICATIONS
U.S. Appl. No. 12/999,034, filed Dec. 14, 2010, Kawakami, et al.
(Continued)

*Primary Examiner* — Thao X Le
*Assistant Examiner* — Matthew Gordon
(74) *Attorney, Agent, or Firm* — Oblon, Spivak, McClelland, Maier & Neustadt, L.L.P.

(57) ABSTRACT

An object of the present invention is to provide: a Cu alloy wiring film that makes it possible to use Cu having a low electrical resistivity as a wiring material, exhibit a high adhesiveness to a glass substrate, and avoid the danger of peel off from the glass substrate; a TFT element for a flat-panel display produced with the Cu alloy wiring film; and a Cu alloy sputtering target used for the deposition of the Cu alloy wiring film. The present invention is a wiring film 2 composing a TFT element 1 for a flat-panel display and a sputtering target used for the deposition of the film and the material comprises Cu as the main component and at least one element selected from the group consisting of Pt, Ir, Pd, and Sm by 0.01 to 0.5 atomic percent in total. The wiring film 2 is layered on a glass substrate 3 and further a transparent conductive film 5 is layered thereon while an insulating film 4 is interposed in between.

19 Claims, 2 Drawing Sheets

U.S. PATENT DOCUMENTS

| | | | |
|---|---|---|---|
| 6,033,542 A | 3/2000 | Yamamoto et al. |
| 6,096,438 A | 8/2000 | Takagi et al. |
| 6,218,206 B1 | 4/2001 | Inoue et al. |
| 6,219,125 B1 | 4/2001 | Ishikura et al. |
| 6,252,247 B1 | 6/2001 | Sakata et al. |
| 7,098,539 B2 | 8/2006 | Gotoh et al. |
| 7,154,180 B2 | 12/2006 | Gotoh et al. |
| 7,262,085 B2 | 8/2007 | Gotoh et al. |
| 7,365,810 B2 | 4/2008 | Gotoh et al. |
| 7,411,298 B2 | 8/2008 | Kawakami et al. |
| 2003/0047812 A1 | 3/2003 | Hagihara et al. |
| 2004/0125257 A1 | 7/2004 | Chae et al. |
| 2004/0126608 A1 | 7/2004 | Gotoh et al. |
| 2004/0187984 A1 | 9/2004 | Ueno |
| 2005/0184395 A1 | 8/2005 | Gotoh et al. |
| 2005/0224795 A1 | 10/2005 | Gotoh et al. |
| 2006/0007366 A1 | 1/2006 | Gotoh et al. |
| 2006/0091792 A1 | 5/2006 | Kugimiya et al. |
| 2006/0151788 A1* | 7/2006 | Cho et al. ................ 257/72 |
| 2006/0180250 A1 | 8/2006 | Kugimiya et al. |
| 2006/0181198 A1 | 8/2006 | Gotoh et al. |
| 2006/0237849 A1 | 10/2006 | Gotoh et al. |
| 2006/0275618 A1 | 12/2006 | Kugimiya et al. |
| 2007/0002239 A1 | 1/2007 | Koike |
| 2007/0040172 A1 | 2/2007 | Kawakami et al. |
| 2007/0040173 A1 | 2/2007 | Kugimiya et al. |
| 2007/0278497 A1 | 12/2007 | Kawakami et al. |
| 2008/0081532 A1 | 4/2008 | Okuno |
| 2008/0121522 A1 | 5/2008 | Ehira et al. |
| 2008/0223718 A1 | 9/2008 | Takagi et al. |
| 2008/0315203 A1 | 12/2008 | Hino et al. |
| 2009/0001373 A1 | 1/2009 | Ochi et al. |
| 2009/0004490 A1 | 1/2009 | Gotou et al. |
| 2009/0011261 A1 | 1/2009 | Gotou |
| 2009/0133784 A1 | 5/2009 | Kugimiya et al. |
| 2010/0032186 A1 | 2/2010 | Gotou et al. |
| 2010/0207121 A1 | 8/2010 | Hino et al. |
| 2010/0231116 A1 | 9/2010 | Ochi et al. |
| 2010/0295053 A1 | 11/2010 | Ochi et al. |
| 2010/0328247 A1 | 12/2010 | Miki et al. |
| 2011/0008640 A1 | 1/2011 | Goto et al. |
| 2011/0019350 A1 | 1/2011 | Nakai et al. |
| 2011/0024761 A1 | 2/2011 | Kawakami et al. |

FOREIGN PATENT DOCUMENTS

| | | |
|---|---|---|
| JP | 8 8498 | 1/1996 |
| JP | 8 138461 | 5/1996 |
| JP | 10 133597 | 5/1998 |
| JP | 10 186389 | 7/1998 |
| JP | 11 283934 | 10/1999 |
| JP | 11 284195 | 10/1999 |
| JP | 11 337976 | 12/1999 |
| JP | 2002 75101 | 3/2002 |
| JP | 2003 273109 | 9/2003 |
| JP | 2003 342563 | 12/2003 |
| JP | 2004 91907 | 3/2004 |
| JP | 2004 212940 | 7/2004 |
| JP | 2006 24754 | 1/2006 |
| JP | 2006 025347 | 3/2006 |
| JP | 2006 77295 | 3/2006 |
| JP | 2006 91907 | 4/2006 |
| JP | 2006 108622 | 4/2006 |
| JP | 2006 193783 | 7/2006 |

OTHER PUBLICATIONS

U.S. Appl. No. 13/056,444, filed Jan. 28, 2011, Onishi, et al.

* cited by examiner (a)

(b)

CU ALLOY WIRING FILM, TFT ELEMENT FOR FLAT-PANEL DISPLAY USING THE CU ALLOY WIRING FILM, AND CU ALLOY SPUTTERING TARGET FOR DEPOSITING THE CU ALLOY WIRING FILM

TECHNICAL FIELD

The present invention relates to: a Cu alloy wiring film composing a TFT element for a flat-panel display such as a liquid crystal display, an organic electroluminescence display, or the like; a TFT element for a flat-panel display produced by using the Cu alloy wiring film; and a Cu alloy sputtering target used for the deposition of the Cu alloy wiring film.

BACKGROUND ART

A liquid crystal display is explained as a representative of flat-panel displays that have come to be widely adopted in recent years. A liquid crystal display is used widely in applications ranging from a portable phone to a large-size television exceeding 100 inches. Such a liquid crystal display is categorized into a simple matrix liquid crystal display and an active matrix liquid crystal display by the method for driving pixels. In the two kinds of liquid crystal displays, the active matrix liquid crystal display incorporating a thin film transistor (abbreviated as TFT in this description) as a switching element is the main stream in the current liquid crystal displays since it has a high image quality and a good conformity with high speed moving images.

A liquid crystal display device of an active matrix liquid crystal display comprises: a glass-made TFT module substrate; a glass-made opposing substrate installed opposite the TFT module substrate; and a liquid crystal layer functioning as an optical modulator installed between the TFT module substrate and the opposing substrate. Here in the description, explanations are hereunder based on the premise that the TFT module substrate (the glass substrate) is located on the lower side and the opposing substrate is located on the upper side in an liquid crystal display device.

FIG. 1 shows a cross-sectional view of a TFT element 1 for a flat-panel display composing such a liquid crystal display device. A wiring film 2, a transparent conductive film (a transparent pixel electrode film) 5, a TFT 6, and others are installed on the upper surface of a glass substrate (a TFT module substrate) 3. The transparent conductive film 5 is an indium tin oxide (ITO) thin film, an indium zinc oxide (IZO) thin film, or the like. Meanwhile, the glass substrate (the TFT module substrate) 3 is driven by a driver circuit and a control circuit connected through a TAB tape.

Although the following units are not shown in the figure, on the bottom surface of the opposing substrate facing the TFT module substrate, a common electrode extending all over the surface, a color filter placed at a position facing the transparent conductive film, and a light-shielding film placed at a position facing the TFT and the like are installed. In addition, an orientation film to orient liquid crystal molecules contained in the liquid crystal layer into a predetermined direction is installed. Further, polarizing plates are installed on the bottom surface side of the TFT module substrate and the upper surface side of the opposing substrate, respectively.

A backlight is installed at the lower part of the liquid crystal display device constructed as stated above and the light passes through from the TFT module substrate side to the opposing substrate side. At each of unit pixels in the liquid crystal layer of the liquid crystal display, the electric field between the opposing substrate and the transparent conductive film (the transparent pixel electrode film) is controlled by the TFT, the orientation of liquid crystal molecules changes by the electric field in the liquid crystal layer, and the light passing through the liquid crystal layer is modulated (shielded or transmitted). By so doing, the quantity of the light transmitted through the opposing substrate is controlled and an image is displayed.

As shown in FIG. 1, a conventional TFT element 1 for a flat-panel display has a wiring film (scanning lines) 2 comprising an aluminum alloy film on the upper surface of a TFT module substrate 3 and a part of the wiring film 2 functions as a gate electrode 7 to control ON/OFF of a TFT 6. Further, a signal line 9 comprising an aluminum alloy film is formed in the direction perpendicular to the wiring film 2 on the upper surface of a gate insulating film 8 installed so as to cover the wiring film 2. A part of the signal line 9 functions as a source electrode 10 of the TFT 6. A transparent conductive film (a transparent pixel electrode film) 5, for example, comprising ITO is formed in the pixel region on the gate insulating film 8. A drain electrode 11 of the TFT 6 comprising an aluminum alloy film formed on the upper surface of the gate insulating film 8 electrically contacts the transparent conductive film 5.

Firstly, when a gate voltage is applied to the gate electrode 7 through the wiring film 2, the TFT 6 is turned on, a drive voltage applied to the signal line 9 beforehand is applied to the transparent conductive film 5 from the source electrode 10 through the drain electrode 11, a sufficient amount of potential difference is generated between the transparent conductive film 5 and the common electrode in the opposing substrate when a drive voltage of a predetermined level is applied to the transparent conductive film 5, and the liquid crystal molecules comprised in the liquid crystal layer are oriented and optical modulation is caused.

As explained above, a conventional wiring part such as a wiring film including a gate electrode has been made of a film of a high-melting-point metal, such as Mo or Cr, and an aluminum alloy film. As a liquid crystal display is getting larger in size and higher in image quality however, the electrical resistance of the wiring film increases, problems such as signal delay, electric power loss, and others appear, and therefore copper (Cu) of a lower electrical resistivity than aluminum (Al) draws attention.

Incidentally, the electrical resistivity of an Al-2 atomic % Nd thin film used as a conventional material is $4.1 \times 10^{-6}$ Ω·cm after heat treatment is applied at 350° C. for 30 minutes in vacuum and the electrical resistivity of a Cu thin film is $2.0 \times 10^{-6}$ Ω·cm after heat treatment is applied at 350° C. for 30 minutes in vacuum. Problems such as peel off do not appear even when an Al wiring film is formed directly on a glass substrate. When a Cu wiring film is formed on a glass substrate however, the problem has been that the Cu wiring film peels off from the glass substrate since the adhesiveness between glass and Cu is poor.

As patents to solve the problems, various technologies described in Patent Documents 1 to 9 are proposed.

In the technology described in Patent Documents 1 and 2, a layer of a high-melting-point metal such as molybdenum (Mo) or chromium (Cr) is interposed between a Cu wiring film and a glass substrate. By forming such a primary layer as excellent in adhesiveness, the adhesiveness of the wiring film itself is improved and the buildup or the breakage of the Cu wiring film is prevented when patterns are formed. However arising new problems have been that not only a process to form a high-melting-point metal layer as the primary layer is added but also, since two different metals of Cu and the high-melting-point metal are layered, corrosion occurs at the interface between Cu and the high-melting-point metal when a chemical solution is applied for etching and a desirable cross-sectional shape of the wiring film (it is considered that the desirable taper angle is 45 to 60 degrees) is not formed because of the difference of the etching rates in the layers. Another problem has been that a process related to forming patterns of the Cu wiring film by using an etching liquid suitable for each of the layers has to be added in order to form a desirable cross-sectional shape of the wiring film and thereby the production cost of a liquid crystal panel increases.

In the technology described in Patent Document 3, it is said that adhesiveness improves by coating a glass substrate with a chromium (Cr) film as a primary layer, forming a Cu layer comprising Cr thereon, and separating into Cu—Cr two layers by applying heat treatment. Even by this technology however, it is very difficult to adjust the cross-sectional shape of a wiring film. Moreover, the electrical resistivity of Cr is $12.9 \times 10^{-6}$ Ω·cm, which is higher than the electrical resistivities of Cu and Al-2 atomic % Nd, and thus problems of signal delay and electric power loss caused by the increase of the wiring resistance occur.

In the technology described in Patent Document 4, it is said that adhesiveness can be improved by forming a resin layer and a layer of a metal such as Cr or the like between a glass substrate and a Cu wire. The problem of the technology however is that the resin layer deteriorates by the thermal history in the production process of a liquid crystal display and the adhesiveness rather deteriorates.

In the technology described in Patent Document 5, it is said that the adhesiveness of a glass substrate is improved by using an alloy produced by adding gold (Au) or cobalt (Co) to Cu. However, although a Cu—Au alloy thin film and a Cu—Co alloy thin film are more excellent than a Cu thin film in adhesiveness, the adhesiveness is still insufficient for a liquid crystal display (actual peel test data of a Cu—Au alloy thin film and others are described in Examples).

In the technology described in Patent Document 6, silicon (Si) that is the main component of a glass substrate is likely to react with Cu, thus the electrical resistance of a Cu wire possibly increases, and therefore a Cu film comprising nitrogen (N) ($Cu_xN$) is firstly deposited on the upper surface of a glass-made transparent substrate by sputtering, and then a Cu layer is formed. Further, in the technology described in Patent Document 7, it is proposed to use a Cu wiring film comprising nitrogen ($Cu_xN$) in order to prevent the Cu wiring film from oxidizing and improve the adhesiveness to the substrate. Since the $Cu_xN$ itself is not a stable compound however, the problem of both the technologies described in Parent Documents 6 and 7 has been that N atoms diffuse in the Cu wiring film through the thermal history in the production process of a liquid crystal display and the electric resistance of the wire increases.

In the technology described in Patent Document 8, a Cu wiring film is formed by firstly coating the upper surface of a glass substrate with a silicon nitride film, successively vapor-depositing a primary metal layer comprising tantalum (Ta) or the like, further forming a metal seed layer comprising Cu or the like thereon, and finally applying nonelectrolytic plating. The problems of the technology however are that the number of processes to form a wiring film is many, the processes are so complicated as to be optimized, a wet process is included, and thus contamination by impurities and necessity of waste treatment arise.

In the technology described in Patent Document 9, it is proposed to form a wiring pattern with craft polymer having electrical conductivity and successively form a Cu wiring film by nonelectrolytic plating. The problem of the technology however is that the craft polymer (a resin layer) deteriorates through the thermal history in the production process of a liquid crystal display and the adhesiveness rather deteriorates.

Patent Document 1: JP-A No. 66423/1995
Patent Document 2: JP-A No. 8498/1996
Patent Document 3: JP-A No. 138461/1996
Patent Document 4: JP-A No. 186389/1998
Patent Document 5: JP-A No. 342563/2003
Patent Document 6: JP-A No. 212940/2004
Patent Document 7: JP-A No. 133597/1998
Patent Document 8: JP-A No. 24754/2006
Patent Document 9: JP-A No. 108622/2006

DISCLOSURE OF THE INVENTION

Problem to be Solved by the Invention

The present invention has been established to solve the above conventional various problems and an object of the present invention is, by using a Cu alloy having a specific composition as a wiring material, to provide: a Cu alloy wiring film that makes it possible to be used as a wiring material having a low electrical resistivity, exhibit a high adhesiveness to a glass substrate composing a liquid crystal display device in a flat-panel display, avoid deterioration and alternation in the production process, and also avoid the danger of peel off from the glass substrate; a TFT element for a flat-panel display produced with the Cu alloy wiring film; and a Cu alloy sputtering target used for the deposition of the Cu alloy wiring film.

Means for Solving the Problem

The invention according to Claim 1 is a Cu alloy wiring film composing a TFT element for a flat-panel display, wherein the wiring film comprises Cu as the main component and at least one element selected from the group consisting of Pt, Ir, Pd, and Sm by 0.01 to 0.5 atomic percent in total.

The invention according to Claim 2 is a Cu alloy wiring film composing a TFT element for a flat-panel display, wherein the wiring film comprises Cu as the main component and at least one element selected from the group consisting of Ni, Pt, Ir, Pd, Ru, Cr, Nb, W, and rare-earth metals by 0.01 to 0.5 atomic percent in total.

The invention according to Claim 3 is a Cu alloy wiring film composing a TFT element for a flat-panel display, wherein: the wiring film comprises Cu as the main component, Ni, and further at least one additional metal element selected from the group consisting of Pt, Ir, Pd, Ru, Cr, Nb, W, and rare-earth metals; and the content of the additional metal elements including Ni is 0.01 to 0.5 atomic percent in total.

The invention according to Claim 4 is a Cu alloy wiring film composing a TFT element for a flat-panel display, wherein: the wiring film comprises Cu as the main component, Pt, and further at least one additional metal element selected from the group consisting of Ni, Ir, Pd, Ru, Cr, Nb, W, and rare-earth metals; and the content of the additional metal elements including Pt is 0.01 to 0.5 atomic percent in total.

The invention according to Claim 5 is a TFT element for a flat-panel display, wherein the TFT element is produced by layering a wiring film according to any one of Claims 1 to 4 on a glass substrate and layering a transparent conductive film thereon while at least an interlayer insulating film is interposed in between.

The invention according to Claim 6 is a Cu alloy sputtering target to deposit a wiring film according to Claim 1, wherein the sputtering target comprises Cu as the main component and at least one element selected from the group consisting of Pt, Ir, Pd, and Sm by 0.01 to 0.5 atomic percent in total.

The invention according to Claim 7 is a Cu alloy sputtering target to deposit a wiring film according to Claim 2, wherein the sputtering target comprises Cu as the main component and at least one element selected from the group consisting of Ni, Pt, Ir, Pd, Ru, Cr, Nb, W, and rare-earth metals by 0.01 to 0.5 atomic percent in total.

The invention according to Claim 8 is a Cu alloy sputtering target to deposit a wiring film according to Claim 3, wherein the sputtering target comprises Cu as the main component, Ni, and further at least one additional metal element selected from the group consisting of Pt, Ir, Pd, Ru, Cr, Nb, W, and rare-earth metals; and the content of the additional metal elements including Ni is 0.01 to 0.5 atomic percent in total.

The invention according to Claim 9 is a Cu alloy sputtering target to deposit a wiring film according to Claim 4, wherein the sputtering target comprises Cu as the main component, Pt, and further at least one additional metal element selected from the group consisting of Ni, Ir, Pd, Ru, Cr, Nb, W, and rare-earth metals; and the content of the additional metal elements including Pt is 0.01 to 0.5 atomic percent in total.

Effect of the Invention

A Cu alloy wiring film according to the present invention makes it possible to use Cu, which has been hardly usable because of the poor adhesiveness to a glass substrate in spite of the low electrical resistivity, as a wiring material having a high adhesiveness to a glass substrate. Further, a TFT element for a flat-panel display according to the present invention that uses the above Cu alloy wiring film makes it possible: not only to use Cu of a low electrical resistivity as a wiring material; but also to improve the adhesiveness to a glass substrate composing the liquid crystal display device of a flat-panel display, avoid deterioration and alternation in the production process, and also avoid the danger of peel off from the glass substrate. Moreover, since a wiring film can be layered directly on a glass substrate, the number of processes required for the production can be reduced. In addition, a Cu alloy sputtering target according to the present invention that is used for depositing the above Cu alloy wiring film makes it possible to use Cu, which has been hardly usable because of the poor adhesiveness to a glass substrate in spite of the low electrical resistivity, as a wiring material having a high adhesiveness to a glass substrate.

Figure 1:
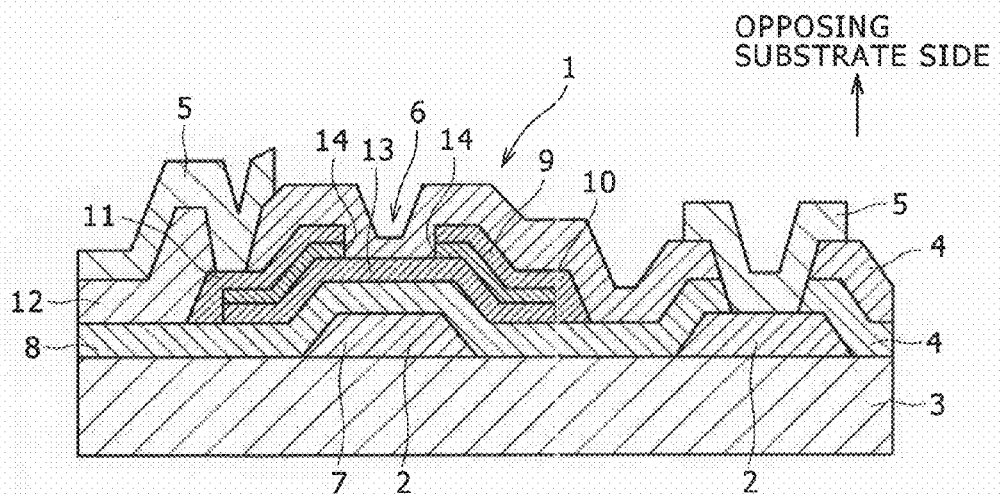
FIG. 1 is a vertical sectional view of a TFT element for a flat-panel display.

| Explanation of Reference Numerals | |
|---|---|
| 1 | TFT element for flat-panel display |
| 2 | Wiring film |
| 3 | Glass substrate |
| 4 | Insulating film |
| 5 | Transparent conductive film |
| 6 | TFT |
| 7 | Gate electrode |
| 8 | Gate insulating film |
| 9 | Signal line |
| 10 | source electrode |
| 11 | Drain electrode |
| 12 | Interlayer insulating film |
| 13 | Channel amorphous silicon |
| 14 | $n^+$ amorphous silicon |

BEST MODE FOR CARRYING OUT THE INVENTION

The present invention is hereunder explained further in detail on the basis of the embodiments shown in the attached drawings.

FIG. 1 shows a cross-sectional structure of a TFT element for a flat-panel display composing a liquid crystal display device as it has been explained in Background Art. The reference numeral 1 represents a TFT element for a flat-panel display composing a liquid crystal display device and the reference numeral 2 represents a Cu alloy wiring film comprising copper (Cu) as the main component and at least one element selected from the group consisting of platinum (Pt), iridium (Ir), palladium (Pd), and samarium (Sm) by 0.01 to 0.5 atomic percent in total.

The reference numeral 3 represents a glass substrate and the reference numeral 4 represents a multilayered insulating film layered on the wiring film 2, each of the layers being a thin film comprising $SiN_x$ or the like. The reference numeral 5 represents a transparent conductive film (a transparent pixel electrode film) layered further on the insulating film 4 and is a thin film comprising indium tin oxide (ITO), indium zinc oxide (IZO), or the like.

The reference numeral 6 represents a TFT incorporated into the liquid crystal display device 1 as a switching element and the reference numeral 7 that also composes a part of the wiring film 2 represents a gate electrode to control on/off of the TFT 6. The reference numeral 8 represents a gate insulating film that also composes a part of the insulating film layered in the manner of covering the upper surface of the wiring film 2 and the reference numeral 9 represents a signal line formed on the upper surface of the gate insulating film 8 in a direction perpendicular to the wiring film 2 and a part of the signal line 9 functions as a source electrode 10. The reference numeral 11 represents a drain electrode and electrically contacts the transparent conductive film 5. Further, both the source electrode 10 (the signal line 9) and the drain electrode 11 comprise a Cu alloy comprising at least one element selected from the group consisting of Pt, Ir, Pd, and Sm by 0.01 to 0.5 atomic percent in total in the same way as the wiring film. The reference numeral 12 represents an interlayer insulating film that also composes a part of the insulating film, the reference numeral 13 represents channel amorphous silicon, and the reference numeral 14 represents $n^+$ amorphous silicon.

Meanwhile, although it has been explained that the content of the metal elements added to a Cu alloy composing a wiring film 2 is in the range of 0.01 to 0.5 atomic percent in total, the content of the additional metal elements is preferably in the range of 0.01 to 0.3 atomic percent in total in order to take the advantage that a Cu alloy has a low electrical resistivity in addition to the advantage of good adhesiveness. Further, the content of the additional metal elements is yet preferably in the range of 0.01 to 0.2 atomic percent in total.

Further, as it has been explained earlier, by making the source electrode 10 and the drain electrode 11 of a Cu alloy comprising at least one element selected from the group consisting of Pt, Ir, Pd, and Sm by 0.01 to 0.5 atomic percent in total in the same way as the wiring film 2, the wiring material can be used commonly. Moreover, since the Cu alloy is excellent in electrical resistivity and the contact characteristic with the transparent conductive film 5, the Cu alloy can be used as the source electrode 10 and the drain electrode 11 (test results are described in Examples).

Furthermore, by irradiating the surface of the glass substrate 3 before coated with a film with ultraviolet rays, contaminations on the outermost surface of the glass substrate 3 can be removed and the adhesiveness of the wiring film 2 layered thereon improves further.

Successively, the following test is carried out in order to survey the reason why the adhesiveness improves by layering a wiring film 2 comprising a Cu alloy comprising at least one element selected from the group consisting of Pt, Ir, Pd, and Sm on a glass substrate 3. In the test, a wiring film 2 comprising a Cu alloy comprising Pt is deposited on a glass substrate 3 (#1737 made by Corning Incorporated, 0.7 mm in thickness) at room temperature so that the film thickness may be 300 nm by the DC magnetron sputtering method and the concentration distribution of constituent elements is analyzed from the surface side of the wiring film 2 toward the glass substrate 3 by radiofrequency glow discharge optical emission spectroscopy (GD-OES). The results of the analysis are shown in FIG. 2.

Figure 2:
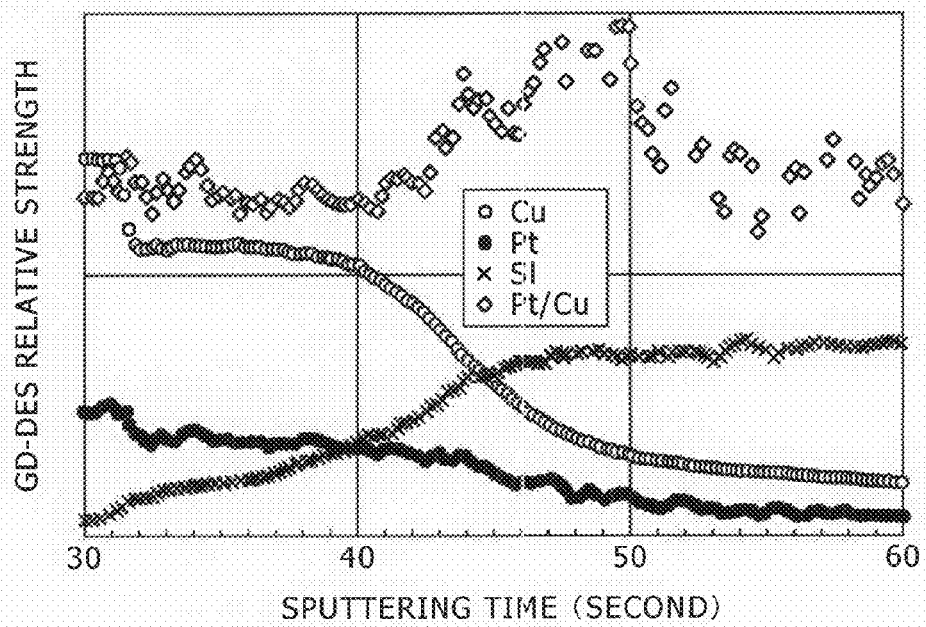
FIG. 2 is a reference graph showing the concentration distribution of elements as a result of composition analysis applied from the surface side of a wiring film toward a glass substrate by radiofrequency glow discharge optical emission spectroscopy.

In FIG. 2, the quantities of both Cu and Pt are almost constant for about 40 seconds from the start of the sputtering and also the concentration ratio of Pt to Cu (Pt/Cu) is almost constant. This means that the composition of the wiring film 2 does not change from the surface to a certain depth.

Thereafter, after the lapse of 40 seconds, the Cu element quantity reduces sharply and the ratio Pt/Cu increases in the vicinity of 43 to 50 seconds. In contrast, the Si element quantity increases sharply after the lapse of 40 seconds. This means that the analysis plane of the GD-OES reaches the surface of the glass substrate 3. That is, almost all of the data after the sharp increase of the Si element quantity indicate the composition of the glass substrate 3.

Eventually, the data in the vicinity of 43 to 50 seconds show the element composition of the wiring film 2 in the vicinity of the bottom of the wiring film 2, namely in the vicinity of the interface between the wiring film 2 and the glass substrate 3. According to the analysis data of the ratio Pt/Cu, the proportion of Pt that is the additional metal element increases in the vicinity of the interface and the thickening phenomenon that Pt concentrates in the vicinity of the interface with the glass substrate 3 is recognized.

Cu itself is poor in adhesiveness to the glass substrate 3 but, as it is verified from the test result, the adhesiveness between the wiring film 2 and the glass substrate 3 improves by the thickening of Pt that is the additional metal element in the vicinity of the interface with the glass substrate 3.

Here, the thickening phenomenon of such an additional metal element in the vicinity of an interface is caused by the diffusion of the additional metal element in the thin film (the wiring film 2) comprising a Cu alloy. A thin film deposited by the sputtering method has a columnar polycrystal structure and hence an additional metal element can easily diffuse in the thin film. In the case where a heating process of a high temperature is included in the production processes of a liquid crystal display device, an additional metal element tends to diffuse more easily, the thickening phenomenon of the additional metal element comes to be more conspicuous, and the adhesiveness between a wiring film 2 and a glass substrate 3 improves further.

Here, although the case where the additional metal element is Pt is shown in the above test, a similar effect can be obtained even in the case where the additional metal element is Ir, Pd, or Sm and also in the case where those elements are added in plural.

As it has been explained above, a metal element added to Cu diffuses and concentrates in the vicinity of the interface with a glass substrate 3 but the quantity of the additional metal element at another portion in the formed wiring film 2 inversely reduces, and hence the electrical resistivity does not increase and rather an electrical resistivity close to a low electrical resistivity that Cu itself naturally has is shown.

Although the above explanations have been made on the premise that the wiring film 2 is deposited by the sputtering method, any other thin film forming method may be used for forming the wiring film 2. Here, the sputtering target used for depositing a film by the sputtering method has the same composition as the wiring film 2. When a wiring film 2 has a composition comprising Cu as the main component and at least one element selected from the group consisting of Pt, Ir, Pd, and Sm by 0.01 to 0.5 atomic percent in total, the sputtering target has also to comprise Cu as the main component and at least one element selected from the group consisting of Pt, Ir, Pd, and Sm by 0.01 to 0.5 atomic percent in total in conformity with the composition of the wiring film 2. Further, the total quantity of the additional metal elements is preferably in the range of 0.01 to 0.3 atomic percent, and yet preferably in the range of 0.01 to 0.2 atomic percent.

Here, the above explanations have been made on the basis of the embodiment wherein the wiring film 2, the source electrode 10 (the signal line 9), the drain electrode 11, and the sputtering target have a composition comprising Cu as the main component and at least one element selected from the group consisting of Pt, Ir, Pd, and Sm by 0.01 to 0.5 atomic percent in total. However, the functions and effects similar to the above embodiment can also be exhibited even when the wiring film 2, the source electrode 10 (the signal line 9), the drain electrode 11, and the sputtering target have a composition shown below.

That is, the wiring film 2, the source electrode 10 (the signal line 9), the drain electrode 11, and the sputtering target may have a composition comprising Cu as the main component and at least one element selected from the group consisting of Ni, Pt, Ir, Pd, Ru, Cr, Nb, W, and rare-earth metals by 0.01 to 0.5 atomic percent in total. Further, they may have a composition comprising Cu as the main component, Ni, and further at least one additional metal element selected from the group consisting of Pt, Ir, Pd, Ru, Cr, Nb, W, and rare-earth metals, and the content of the additional metal elements including Ni may be 0.01 to 0.5 atomic percent in total. Furthermore, they may have a composition comprising Cu as the main component, Pt, and further at least one additional metal element selected from the group consisting of Ni, Ir, Pd, Ru, Cr, Nb, W, and rare-earth metals, and the content of the additional metal elements including Pt may be 0.01 to 0.5 atomic percent in total.

In the cases of those embodiments too, it has been explained that the total content of the additional metal elements other than Cu is in the range of 0.01 to 0.5 atomic percent in the same way as the embodiment explained earlier.

In order to take the advantage that a Cu alloy has a low electrical resistivity in addition to the advantage of good adhesiveness however, the total content of the additional metal elements is preferably in the range of 0.01 to 0.3 atomic percent and yet preferably in the range of 0.01 to 0.2 atomic percent.

EXAMPLES

Peel Off Rate Measurement Test

In order to evaluate the adhesiveness of a wiring film on a glass substrate, firstly the peel test of a wiring film is carried out with an adhesive tape as shown below.

In the test, a glass substrate #1737, 0.7 mm in thickness, made by Corning Incorporated is used. As the wiring film, a Cu thin film 300 nm in thickness is vapor-deposited at room temperature (25° C.) by the DC magnetron sputtering method. The Cu thin film is deposited with a sputtering target of a pure Cu on which a chip of an additional metal element is mounted. Slits are formed on the surface of a formed wiring film with a cutter knife so as to form a grid at intervals of 1 mm. Successively, an adhesive tape is put on the thin film and peeled off at a stroke while the peeling off angle of the adhesive tape is kept at 60 degrees, the number of the segments peeled off by the adhesive tape in the grid is counted, and the ratio of the number to the total number of the segment (a peel off rate) is obtained.

The test is carried out in the cases where: heat treatment is applied at 300° C. after a wiring film is formed; heat treatment is not applied (described as room temperature in Tables 1, 2, and 3); a mending tape made by Scotch is used as the adhesive tape; a 8422B tape made by Sumitomo 3M Limited, which has a stronger adhesiveness, is used as the adhesive tape; and the kinds and the addition amounts of additional metal elements are changed.

In the evaluation of the test, a case where the peel off rate is less than 10% is judged as good and a case where the peel off rate is 10% or more is judged as poor.

[Electrical Resistivity Measurement Test]

Successively, in the same way as the peel off rate measurement test, a thin film 300 nm in thickness is deposited by the DC magnetron sputtering method, thereafter a wiring shape is formed by the photolithography wet etching method, and then an electrical resistivity is measured by the four probe method. Thereafter, the specimen is subjected to heat treatment for 30 minutes at 350° C. in vacuum and then the electrical resistivity is measured again.

In the evaluation of the test, a case where the electrical resistivity after heat treatment at 350° C. is 3.0 μΩ·cm or lower is judged as good and a case where the electrical resistivity exceeds 3.0 μΩ·cm is judged as poor.

[Comprehensive Evaluation]

The results of the peel off rate measurement test and the electrical resistivity measurement test are shown in Tables 1, 2, and 3. As the comprehensive evaluation, a case where both the peel off rate and the electrical resistivity are good is judged as satisfactory and qualified and a case where at least either of the peel off rate or the electrical resistivity is poor is judged as unsatisfactory and disqualified.

TABLE 1

| | No. | Specimen | Heat treatment temperature | Peel off rate measurement test Type of tape | Peel off rate | Electrical resistivity measurement test After film forming (before heat treatment) | After heat treatment | Evaluation |
|---|---|---|---|---|---|---|---|---|
| Invention example | 1 | Cu—0.1Pt | Room temperature | Mending | 0 | 2.5 | 2.3 | ○ |
| | 2 | Cu—0.1Pt | Room temperature | 8422B | 0 | 2.5 | 2.3 | ○ |
| | 3 | Cu—0.1Pt | 300° C. | Mending | 0 | 2.5 | 2.3 | ○ |
| | 4 | Cu—0.1Pt | 300° C. | 8422B | 0 | 2.5 | 2.3 | ○ |
| | 5 | Cu—0.5Pt | Room temperature | 8422B | 0 | 3.2 | 2.9 | ○ |
| | 6 | Cu—0.5Pt | 300° C. | 8422B | 0 | 3.2 | 2.9 | ○ |
| | 7 | Cu—0.01Pt | Room temperature | 8422B | 3 | 2.1 | 2.1 | ○ |
| | 8 | Cu—0.01Pt | 300° C. | 8422B | 1 | 2.1 | 2.1 | ○ |
| | 9 | Cu—0.1Ir | Room temperature | 8422B | 5 | 2.5 | 2.3 | ○ |
| | 10 | Cu—0.1Ir | 300° C. | 8422B | 2 | 2.5 | 2.3 | ○ |
| | 11 | Cu—0.2Pd | Room temperature | 8422B | 3 | 2.4 | 2.3 | ○ |
| | 12 | Cu—0.2Pd | 300° C. | 8422B | 1 | 2.4 | 2.3 | ○ |
| | 13 | Cu—0.15Sm | Room temperature | 8422B | 4 | 2.4 | 2.2 | ○ |
| | 14 | Cu—0.15Sm | 300° C. | 8422B | 1 | 2.4 | 2.2 | ○ |
| | 15 | Cu—0.3Ni | Room temperature | 8422B | 8 | 2.7 | 2.4 | ○ |
| | 16 | Cu—0.5Ni | Room temperature | 8422B | 3 | 3.0 | 2.5 | ○ |
| | 17 | Cu—0.5Ru | Room temperature | 8422B | 4 | 3.4 | 2.9 | ○ |
| | 18 | Cu—0.5Cr | Room temperature | 8422B | 6 | 4.8 | 2.9 | ○ |
| | 19 | Cu—0.5Nb | Room temperature | 8422B | 3 | 7.9 | 3.0 | ○ |
| | 20 | Cu—0.5W | Room | 8422B | 6 | 6.7 | 3.0 | ○ |

TABLE 1-continued

|  | No. | Specimen | Heat treatment temperature | Type of tape | Peel off rate | Electrical resistivity measurement test After film forming (before heat treatment) | After heat treatment | Evaluation |
|---|---|---|---|---|---|---|---|---|
|  | 21 | Cu—0.5Ce | Room temperature | 8422B | 2 | 8.2 | 2.8 | ○ |

*In the table, the unit of a peel off rate in the peel off rate measurement test is % and the unit of an electrical resistivity in the electrical resistivity measurement test is μΩ · cm in both the cases of after film forming (before heat treatment) and after heat treatment.

TABLE 2

|  | No. | Specimen | Heat treatment temperature | Type of tape | Peel off rate | Electrical resistivity measurement test After film forming (before heat treatment) | After heat treatment | Evaluation |
|---|---|---|---|---|---|---|---|---|
| Invention example | 22 | Cu—0.1Ni—0.1Pt | Room temperature | 8422B | 7 | 2.3 | 2.2 | ○ |
|  | 23 | Cu—0.3Ni—0.1Pt | Room temperature | 8422B | 1 | 2.8 | 2.5 | ○ |
|  | 24 | Cu—0.5Ni—0.1Pt | Room temperature | 8422B | 4 | 3.1 | 2.6 | ○ |
|  | 25 | Cu—0.1Ni—0.1Ir | Room temperature | 8422B | 2 | 2.4 | 2.3 | ○ |
|  | 26 | Cu—0.3Ni—0.1Ir | Room temperature | 8422B | 2 | 3.1 | 2.6 | ○ |
|  | 27 | Cu—0.5Ni—0.1Ir | Room temperature | 8422B | 2 | 3.2 | 2.7 | ○ |
|  | 28 | Cu—0.3Ni—0.2Cr | Room temperature | 8422B | 1 | 3.8 | 2.7 | ○ |
|  | 29 | Cu—0.3Ni—0.2Nb | Room temperature | 8422B | 4 | 5.0 | 2.8 | ○ |
|  | 30 | Cu—0.1Pti—0.1Ir | Room temperature | 8422B | 3 | 2.9 | 2.5 | ○ |
|  | 31 | Cu—0.1Pt—0.2Cr | Room temperature | 8422B | 1 | 3.6 | 2.6 | ○ |
|  | 32 | Cu—0.1Pt—0.2Nb | Room temperature | 8422B | 2 | 4.7 | 2.7 | ○ |

*In the table, the unit of a peel off rate in the peel off rate measurement test is % and the unit of an electrical resistivity in the electrical resistivity measurement test is μΩ · cm in both the cases of after film forming (before heat treatment) and after heat treatment.

TABLE 3

|  | No. | Specimen | Heat treatment temperature | Type of tape | Peel off rate | Electrical resistivity measurement test After film forming (before heat treatment) | After heat treatment | Evaluation |
|---|---|---|---|---|---|---|---|---|
| Comparative example | 33 | Cu | Room temperature | Mending | 40 | 2.1 | 2.1 | X |
|  | 34 | Cu | Room temperature | 8422B | 100 | 2.1 | 2.1 | X |
|  | 35 | Cu—0.6Pt | Room temperature | 8422B | 12 | 3.3 | 3.1 | X |
|  | 36 | Cu—0.6Pt | 300° C. | 8422B | 10 | 3.3 | 3.1 | X |
|  | 37 | Cu—0.005Pt | Room temperature | 8422B | 25 | 2.1 | 2.1 | X |
|  | 38 | Cu—0.005Pt | 300° C. | 8422B | 15 | 2.1 | 2.1 | X |

TABLE 3-continued

|  |  |  | Peel off rate measurement test |  | Electrical resistivity measurement test |  |  |
|---|---|---|---|---|---|---|---|
|  |  |  |  |  | After film forming |  |  |
| No. | Specimen | Heat treatment temperature | Type of tape | Peel off rate | (before heat treatment) | After heat treatment | Evaluation |
| 39 | Cu—0.005Ni | Room temperature | 8422B | 40 | 2.2 | 2.1 | X |
| 40 | Cu—0.1Au | Room temperature | 8422B | 88 | 2.2 | 2.2 | X |
| 41 | Cu—0.1Ag | Room temperature | 8422B | 60 | 2.2 | 2.1 | X |
| 42 | Cu—0.1Ag | 300° C. | 8422B | 100 | 2.2 | 2.1 | X |
| 43 | Cu—0.1Mg | Room temperature | 8422B | 100 | 3.0 | 2.5 | X |
| 44 | Cu—0.1Mg | 300° C. | 8422B | 100 | 3.0 | 2.5 | X |
| 45 | Cu—0.1Ta | Room temperature | 8422B | 100 | 3.4 | 2.5 | X |

*In the table, the unit of a peel off rate in the peel off rate measurement test is % and the unit of an electrical resistivity in the electrical resistivity measurement test is μΩ · cm in both the cases of after film forming (before heat treatment) and after heat treatment.

[Peel Off Rate Measurement Test]

As a result of the peel off rate measurement test, in the cases of the specimen Nos. 1 to 14 each of which is produced by forming a wiring film according to Claim 1 comprising Cu as the main component and at least one element selected from the group consisting of Pt, Ir, Pd, and Sm by 0.01 to 0.5 atomic percent (for example, a specimen comprising Cu and 0.1 atomic percent Pt is abbreviated as Cu-0.1Pt in Table 1) on a glass substrate, the peel off rates of the grids peeled off with adhesive tapes are 0% to 5% and good regardless of whether heat treatment is applied or not after film forming. Further, not only in the case of using a mending tape as the adhesive tape but also in the case of using a 8422B tape having a stronger adhesiveness, the peel off rates are 0% to 5% and good.

Further, in the cases of the specimen Nos. 15 to 21 each of which is produced by forming a wiring film according to Claim 2 comprising Cu as the main component and at least one element selected from the group consisting of Ni, Ru, Cr, Nb, W, and rare-earth metals by 0.01 to 0.5 atomic percent in total on a glass substrate too, the peel off rates of the grids peeled off with adhesive tapes are 2% to 8% and good. Furthermore, in the cases of the specimen Nos. 22 to 29 each of which is produced by forming a wiring film according to Claim 3 comprising Cu as the main component, Ni, and further at least one additional metal element selected from the group consisting of Pt, Ir, Pd, Ru, Cr, Nb, W, and rare-earth metals so that the content of the additional metal elements including Ni may be 0.01 to 0.5 atomic percent in total on a glass substrate too, the peel off rates of the grids peeled off with adhesive tapes are 1% to 7% and good. Moreover, in the cases of the specimen Nos. 30 to 32 each of which is produced by forming a wiring film according to Claim 4 comprising Cu as the main component, Pt, and further at least one additional metal element selected from the group consisting of Ni, Ir, Pd, Ru, Cr, Nb, W, and rare-earth metals so that the content of the additional metal elements including Pt may be 0.01 to 0.5 atomic percent in total on a glass substrate too, the peel off rates of the grids peeled off with adhesive tapes are 1% to 3% and good.

In contrast, in the cases of specimen Nos. 33 and 34 each of which is deposited by sputtering a wiring film of pure Cu on a glass substrate, the peel off rate is 40% in the case of specimen No. 33 where the wiring film is peeled off with the mending tape and the peel off rate is 100% in the case of specimen No. 34 where the 8422B tape made by Sumitomo 3M Limited having a stronger adhesiveness is used. In both the cases, the evaluation results of the peel off rate measurement test are poor.

Further, in the cases of specimen Nos. 35 and 36 where Pt is added to Cu but the content of Pt in the Cu alloy is 0.6 atomic percent and exceeds the content range of the additional metal elements according to Claims 1 and 2, the peel off rate is 12% in the case where heat treatment is not applied immediately after the film forming (specimen No. 35) and the peel off rate is 10% in the case where heat treatment is applied at 300° C. (specimen No. 36). In both the cases, the evaluation results of the peel off rate measurement test are poor.

Inversely, in the cases of specimen Nos. 37 and 38 where Pt is added to Cu but the content of Pt in the Cu alloy is 0.005 atomic percent and does not reach the content range of the additional metal elements according to Claims 1 and 2, the peel off rate is 25% in the case where heat treatment is not applied immediately after the film forming (specimen No. 37) and the peel off rate is 15% in the case where heat treatment is applied at 300° C. (specimen No. 38). In both the cases too, the evaluation results of the peel off rate measurement test are poor. Further, in the case of specimen No. 39 where Ni is added to Cu but the content of Ni in the Cu alloy is 0.005 atomic percent and does not reach the content range of the additional metal elements according to Claim 2, the peel off rate is 40% and, in the case too, the evaluation result of the peel off rate measurement test is poor.

Specimen Nos. 40 to 45 are the cases where any one of Au, Ag, Mg, and Ta is used as a metal element added to Cu instead of Pt, Ir, Pd, and Sm according to Claim 1 and Ni, Ru, Cr, Nb, W, and rare-earth metals according to Claim 2. In the cases of specimen Nos. 40 to 45, the peel off rates are 60% to 100% and very high and, in those cases, the evaluation results of the peel off rate measurement test are poor.

[Electrical Resistivity Measurement Test]

In the electrical resistivity measurement test, heat treatment after film forming and peel off with a tape are not carried out unlike the peel off rate measurement test and hence only one kind of test is required and plural tests are not required for samples having an identical component unlike the peel off rate measurement test. For example, although the test of specimen Nos. 1 to 4 can be finished at one time, the data are shown in Table 1 as if four different tests were carried out for the convenience of comprehensive evaluation. In the explanations below too, each specimen number is discussed separately.

As a result of the electrical resistivity measurement test, in the cases of specimen Nos. 1 to 14 each of which is produced by forming a wiring film according to Claim 1 comprising Cu as the main component and at least one element selected from the group consisting of Pt, Ir, Pd, and Sm by 0.01 to 0.5 atomic percent on a glass substrate, the electrical resistivities after heat treatment are 2.1 to 2.9 µΩ·cm and good. Further, in the cases of specimen Nos. 15 to 21 each of which is produced by forming a wiring film according to Claim 2 comprising Cu as the main component and at least one element selected from the group consisting of Ni, Ru, Cr, Nb, W, and rare-earth metals by 0.01 to 0.5 atomic percent in total on a glass substrate too, the electrical resistivities after heat treatment are 2.4 to 3.0 µΩ·cm and good.

Furthermore, in the cases of specimen Nos. 22 to 29 each of which is produced by forming a wiring film according to Claim 3 comprising Cu as the main component, Ni, and further at least one additional metal element selected from the group consisting of Pt, Ir, Pd, Ru, Cr, Nb, W, and rare-earth metals so that the content of the additional metal elements including Ni may be 0.01 to 0.5 atomic percent in total on a glass substrate too, the electrical resistivities after heat treatment are 2.2 to 2.8 µΩ·cm and good. Moreover, in the cases of specimen Nos. 30 to 32 each of which is produced by forming a wiring film according to Claim 4 comprising Cu as the main component, Pt, and further at least one additional metal element selected from the group consisting of Ni, Ir, Pd, Ru, Cr, Nb, W, and rare-earth metals so that the content of the additional metal elements including Pt may be 0.01 to 0.5 atomic percent in total on a glass substrate too, the electrical resistivities after heat treatment are 2.5 to 2.7 µΩ·cm and good.

In addition, in the cases of specimen Nos. 33 and 34 each of which is deposited by sputtering a wiring film of pure Cu on a glass substrate, the electrical resistivities after heat treatment are 2.1 µΩ·cm and the results of the electrical resistivity measurement test are good.

In contrast, in the cases of specimen Nos. 35 and 36 where Pt is added to Cu but the content of Pt in the Cu alloy is 0.6 atomic percent and exceeds the content range of the additional metal elements according to Claims 1 and 2, the electrical resistivities after heat treatment are 3.1 µΩ·cm and the results of the electrical resistivity measurement test are poor.

Inversely, in the cases of specimen Nos. 37 and 38 where Pt is added to Cu but the content of Pt in the Cu alloy is 0.005 atomic percent and does not reach the content range of the additional metal elements according to Claims 1 and 2, the electrical resistivities after heat treatment are 2.1 µΩ·cm and the results of the electrical resistivity measurement test are good.

In the cases of specimen Nos. 40 to 45 where any one of Au, Ag, Mg, and Ta is used as a metal element added to Cu instead of Pt, Ir, Pd, and Sm according to Claim 1 and Ni, Ru, Cr, Nb, W, and rare-earth metals according to Claim 2, the measured electrical resistivities after heat treatment are 2.1 to 2.5 µΩ·cm and the results of the electrical resistivity measurement test are good.

[Comprehensive Evaluation]

In the cases of specimen Nos. 1 to 14 each of which is produced by forming a wiring film according to Claim 1 comprising Cu as the main component and at least one element selected from the group consisting of Pt, Ir, Pd, and Sm by 0.01 to 0.5 atomic percent on a glass substrate, both the peel off rates and the electrical resistivities are good and the comprehensive evaluation is satisfactory and qualified. Further, in the cases of specimen Nos. 15 to 21 each of which is produced by forming a wiring film according to Claim 2 comprising Cu as the main component and at least one element selected from the group consisting of Ni, Ru, Cr, Nb, W, and rare-earth metals by 0.01 to 0.5 atomic percent in total on a glass substrate too, both the peel off rates and the electrical resistivities are good and the comprehensive evaluation is satisfactory and qualified. Furthermore, in the cases of specimen Nos. 22 to 29 each of which is produced by forming a wiring film according to Claim 3 comprising Cu as the main component, Ni, and further at least one additional metal element selected from the group consisting of Pt, Ir, Pd, Ru, Cr, Nb, W, and rare-earth metals so that the content of the additional metal elements including Ni may be 0.01 to 0.5 atomic percent in total on a glass substrate too, both the peel off rates and the electrical resistivities are good and the comprehensive evaluation is satisfactory and qualified. Moreover, in the cases of specimen Nos. 30 to 32 each of which is produced by forming a wiring film according to Claim 4 comprising Cu as the main component, Pt, and further at least one additional metal element selected from the group consisting of Ni, Ir, Pd, Ru, Cr, Nb, W, and rare-earth metals so that the content of the additional metal elements including Pt may be 0.01 to 0.5 atomic percent in total on a glass substrate too, both the peel off rates and the electrical resistivities are good and the comprehensive evaluation is satisfactory and qualified.

In contrast, in the cases of specimen Nos. 33 to 45 each of which is produced by forming: a wiring film of pure Cu; a wiring film of a Cu alloy wherein the content of an additional metal element is not in the range of 0.01 to 0.5 atomic percent; or a wiring film of a Cu alloy wherein the additional metal element is other than Pt, Ir, Pd, Sm, Ni, Ru, Cr, Nb, W, or rare-earth metals on a glass film, at least either the peel off rate or the electrical resistivity is poor and the comprehensive evaluation is unsatisfactory and disqualified.

[Contact Characteristic Test]

Contact characteristic test is carried out as a reference test in order to obtain the contact characteristic between a Cu alloy wire (a source electrode, a drain electrode) and a transparent conductive film (a transparent pixel electrode film).

Figure 3:
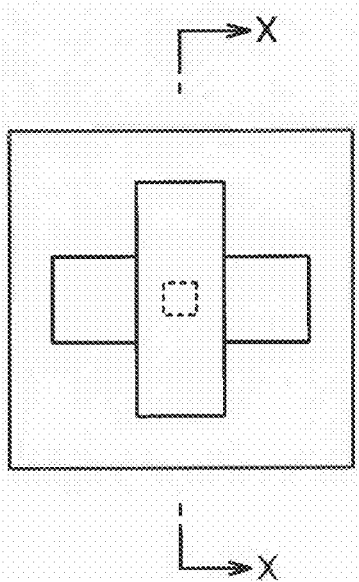
FIG. 3 shows a Kelvin pattern for measuring contact resistance; (a) is a plan view and (b) is a sectional view taken on line X-X of (a).
Figure 3:
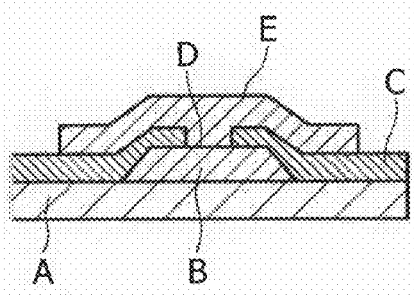

In the test, as shown in FIG. 3, a thin film 300 nm in thickness is deposited on the upper surface of a glass substrate A as a Cu alloy wire B by the DC magnetron sputtering method (the same in the cases of Mo and Cu as comparative examples). An insulating film C ($SiN_x$) 300 nm in thickness is formed thereon in the direction perpendicular to the Cu alloy wire B by the CVD method, and thereafter a contact hole D 10 µm in square is formed in the center of the insulating film C by photolithography. Further, a transparent conductive film E 200 nm in thickness is formed thereon with indium tin oxide (ITO) produced by adding tin oxide of 10 mass % to indium oxide and the contact hole D is also filled with the indium tin oxide at the same time. The transparent conductive film E is deposited under the following conditions for example; ratio $Ar/O_2=24/0.06$ sccm, gas pressure $2.7\times10^{-1}$ Pa, and sputtering power DC 150 W. The electrical resistivity of the transparent conductive film E is low and is $2\times10^{-4}$ Ω·cm.

Thin films 300 nm in thickness are formed with Cu-0.1 atomic % Pt, Cu-0.1 atomic % Ir, Cu-0.2 atomic % Pd, and Cu-0.15 atomic % Sm as the reference examples of the Cu alloy wires B according to the present invention, respectively. Further, as comparative examples, thin films 300 nm in thickness are formed with Mo and pure Cu which have heretofore been used at a contact portion of ITO, and moreover Cu-0.1 atomic % Au and Cu-0.1 atomic % Mg, respectively. Here, the compositions of the reference examples of the Cu alloy wires B according to the present invention are within the range of the composition of a wiring film according to Claim 1.

A contact resistance is obtained by forming a Kelvin pattern as shown in FIG. 3 by the method explained earlier and applying four probe measurement (a method for applying electric current between a transparent conductive film E and a Cu alloy wire B and measuring the voltage drop between the transparent conductive film E and the Cu alloy wire B with another probe). That is, the contact resistance at a contact portion is obtained by applying electric current between a transparent conductive film E and a Cu alloy wire B and monitoring the voltage between the transparent conductive film E and the Cu alloy wire B. The test results are shown in Table 4.

TABLE 4

|  | No. | Specimen | Contact resistance |
|---|---|---|---|
| Reference example according to present invention | 1 | Cu—0.1Pt | 6.0Ω |
|  | 2 | Cu—0.1Ir | 6.5Ω |
|  | 3 | Cu—0.2Pd | 14.2Ω |
|  | 4 | Cu—0.15Sm | 21.7Ω |
| Comparative example | 5 | Mo | 30.0Ω |
|  | 6 | Cu | 31.5Ω |
|  | 7 | Cu—0.1Au | 8.4Ω |
|  | 8 | Cu—0.1Mg | 37.0Ω |

The contact resistances of the specimen Nos. 1 to 4 of the reference examples according to the present invention are lower than that of Mo (specimen No. 5) that has heretofore been used at a contact portion of ITO and it can be said that they are the materials suitable for use as a Cu alloy wire (a source electrode, a drain electrode, and a gate electrode). Here, those materials satisfy the requirements of a Cu alloy wiring film according to Claim 1 and hence it is possible to commonly use the above electrode materials.

Although the present invention has been explained in detail in reference to specific embodiments, it is obvious to those skilled in the art that various changes and modifications may be made without deviating from the point and scope of the present invention. The present application is based on the Japanese Patent Application (JP-A No. 327451/2006) applied on Dec. 4, 2006 and the Japanese Patent Application (JP-A No. 311992/2007) applied on Dec. 3, 2007 and the contents are taken in as the references.

INDUSTRIAL APPLICABILITY

By using a Cu alloy having a specific composition as a wiring material, it is possible to provide: a Cu alloy wiring film that makes it possible to be used as a wiring material having a low electrical resistivity, exhibit a high adhesiveness to a glass substrate composing a liquid crystal display device in a flat-panel display, avoid deterioration and alternation in the production process, and also avoid the danger of peel off from the glass substrate; a TFT element for a flat-panel display produced with the Cu alloy wiring film; and a Cu alloy sputtering target used for the deposition of the Cu alloy wiring film.

The invention claimed is:

1. A Cu alloy wiring film operable as a TFT element for a flat-panel display, wherein: the wiring film comprises Cu, Ni, and at least one additional metal element selected from the group consisting of Pt, Ir, Pd, Ru, Cr, Nb, W, and a rare-earth metal, the content of the at least one additional metal element and Ni being 0.01 to 0.5 atomic percent in total.

2. A Cu alloy wiring film operable as a TFT element for a flat-panel display, wherein: the wiring film comprises Cu, Pt, and at least one additional metal element selected from the group consisting of Ni, Ir, Pd, Ru, Cr, Nb, W, and a rare-earth metal, the content of the at least one additional metal element and Pt being 0.01 to 0.5 atomic percent in total.

3. A Cu alloy sputtering target to deposit a wiring film according to claim 1, wherein the sputtering target comprises Cu, Ni, and further at least one additional metal element selected from the group consisting of Pt, Ir, Pd, Ru, Cr, Nb, W, and a rare-earth metal, the content of the at least one additional metal element and Ni being 0.01 to 0.5 atomic percent in total.

4. A Cu alloy sputtering target to deposit a wiring film according to claim 2, wherein the sputtering target comprises Cu, Pt, and at least one additional metal element selected from the group consisting of Ni, Ir, Pd, Ru, Cr, Nb, W, and a rare-earth metal, the content of the at least one additional metal element and Pt being 0.01 to 0.5 atomic percent in total.

5. A TFT element operable for a flat-panel display, wherein the TFT element is produced by layering a wiring film according to claim 1 on a glass substrate and layering a transparent conductive film thereon where at least an interlayer insulating film is interposed therebetween.

6. A TFT element operable for a flat-panel display, wherein the TFT element is produced by layering a wiring film according to claim 2 on a glass substrate and layering a transparent conductive film thereon where at least an interlayer insulating film is interposed therebetween.

7. The Cu alloy wiring film according to claim 1, wherein the content of the at least one additional metal element and Ni is from 0.01 to 0.3 atomic percent in total.

8. The Cu alloy wiring film according to claim 1, wherein the content of the at least one additional metal element and Ni is from 0.01 to 0.2 atomic percent in total.

9. The Cu alloy wiring film according to claim 2, wherein the content of the at least one additional metal element and Pt is from 0.01 to 0.3 atomic percent in total.

10. The Cu alloy wiring film according to claim 2, wherein the content of the at least one additional metal element and Pt is from 0.01 to 0.2 atomic percent in total.

11. The Cu alloy wiring film according to claim 1, wherein the Cu alloy is a Cu—Ni—Pt alloy having from 0.1 to 0.5 atomic percent of Ni and 0.1 atomic percent of Pt, relative to the total amount of the alloy.

12. The Cu alloy wiring film according to claim 1, wherein the Cu alloy is a Cu—Ni—Ir alloy having from 0.1 to 0.5 atomic percent of Ni and 0.1 atomic percent of Ir, relative to the total amount of the alloy.

13. The Cu alloy wiring film according to claim 2, wherein the Cu alloy is a Cu—Ni—Pt alloy having from 0.1 to 0.5 atomic percent of Ni and 0.1 atomic percent of Pt, relative to the total amount of the alloy.

14. The Cu alloy wiring film according to claim 1, the wiring film comprises Cu, Ni, and at least one additional metal element selected from the group consisting of Pt, Ir, Cr, and Nb, the content of the at least one additional metal element and Ni being 0.01 to 0.5 atomic percent in total.

15. The Cu alloy wiring film according to claim 2, the wiring film comprises Cu, Pt, and at least one additional metal element selected from the group consisting of Ir, Cr, and Nb, the content of the at least one additional metal element and Pt being 0.01 to 0.5 atomic percent in total.

16. The TFT element for a flat-panel display according to claim 5, wherein said transparent conductive film comprises at least one of indium tin oxide and indium zinc oxide.

17. The TFT element for a flat-panel display according to claim 6, wherein said transparent conductive film comprises at least one of indium tin oxide and indium zinc oxide.

18. The TFT element for a flat-panel display according to claim 5, wherein said interlayer insulating film comprises $SiN_x$.

19. The TFT element for a flat-panel display according to claim 6, wherein said interlayer insulating film comprises $SiN_x$.

* * * * *